United States Patent
Seo et al.

(10) Patent No.: US 9,444,490 B2
(45) Date of Patent: Sep. 13, 2016

(54) METHOD OF OPERATING DATA COMPRESSION CIRCUIT AND DEVICES TO PERFORM THE SAME

(71) Applicant: Samsung Electronics Co., Ltd, Suwon-si, Gyeonggi-do (KR)

(72) Inventors: Man Keun Seo, Hwaseong-si (KR); Dae Wook Kim, Osan-si (KR); Hong Rak Son, Anyang-si (KR); Jun Jin Kong, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 62 days.

(21) Appl. No.: 14/146,846

(22) Filed: Jan. 3, 2014

(65) Prior Publication Data
US 2014/0195702 A1 Jul. 10, 2014

(30) Foreign Application Priority Data

Jan. 7, 2013 (KR) ........................ 10-2013-0001407

(51) Int. Cl.
*H03M 7/38* (2006.01)
*H03M 7/30* (2006.01)
*G06F 13/14* (2006.01)

(52) U.S. Cl.
CPC ............. *H03M 7/30* (2013.01); *G06F 13/14* (2013.01); *H03M 7/3084* (2013.01); *H03M 7/3091* (2013.01)

(58) Field of Classification Search
None
See application file for complete search history.

(56) References Cited

U.S. PATENT DOCUMENTS

| 5,903,230 | A | * | 5/1999 | Masenas | H03M 7/3086 341/51 |
|---|---|---|---|---|---|
| 6,128,094 | A | | 10/2000 | Smith | |
| 6,624,762 | B1 | | 9/2003 | End, III | |
| 2001/0047359 | A1 | * | 11/2001 | Videcrantz et al. | 707/101 |
| 2009/0006510 | A1 | * | 1/2009 | Laker et al. | 708/203 |
| 2010/0141488 | A1 | | 6/2010 | Baktir et al. | |
| 2010/0225506 | A1 | | 9/2010 | Chen et al. | |
| 2010/0302077 | A1 | | 12/2010 | Abali et al. | |
| 2011/0087640 | A1 | | 4/2011 | Dodd et al. | |
| 2011/0154169 | A1 | | 6/2011 | Gopal et al. | |
| 2012/0286979 | A1 | * | 11/2012 | Carlson | 341/51 |

FOREIGN PATENT DOCUMENTS

EP 0 977 152 A2 * 2/2000

* cited by examiner

*Primary Examiner* — Ilwoo Park
(74) *Attorney, Agent, or Firm* — Muir Patent Law, PLLC

(57) ABSTRACT

A method of operating a data compression circuit includes receiving and storing a plurality of data blocks until a cache is full and writing the data blocks that have been stored in the cache to a buffer memory when the cache is full. The method also includes performing forced literal/literal encoding on each of the data blocks regardless of repetitiveness of each data block when the cache is full.

16 Claims, 7 Drawing Sheets

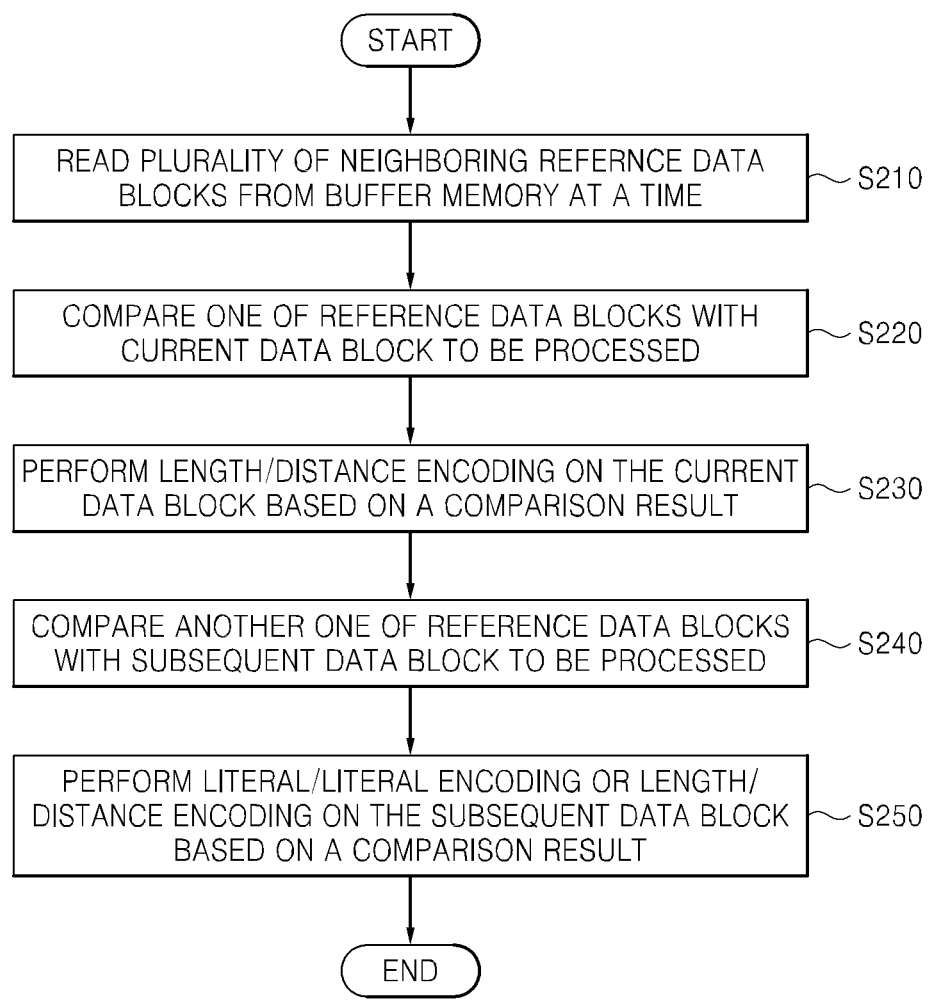

METHOD OF OPERATING DATA COMPRESSION CIRCUIT AND DEVICES TO PERFORM THE SAME

CROSS-REFERENCE TO RELATED APPLICATIONS

This application claims priority under 35 U.S.C. §119(a) from Korean Patent Application No. 10-2013-0001407 filed on Jan. 7, 2013, the disclosure of which is hereby incorporated by reference in its entirety.

BACKGROUND

1. Field

Embodiments of the present general inventive concept relate to data processing technology, and more particularly, to an efficient buffer memory access method, a data compression method, and devices to perform the methods.

2. Description of the Related Art

Data compression technology is used in various ways to increase a data transfer rate and the utilization of storage space in communication devices and/or data storage devices. The data compression technology reduces the size of data to be stored in flash memory based data storage devices, thereby reducing the number of writes and/or the number of reads in the storage devices and increasing the life expectancy of the storage devices.

There are lossless compression and lossy compression in data compression methods used for data storage devices. For the lossless compression, there are two lossless data compression algorithms, LZ77 and LZ78, disclosed in the papers written by Abraham Lempel and Jacob Ziv in 1977 and 1978 and a universal lossless data compression algorithm referred to as LZW or Lempel-Ziv Ross Williams (LZRVV) created by Abraham Lempel, Jacob Ziv, and Terry Welch.

SUMMARY

The present general inventive concept provides a method of receiving and storing a plurality of data blocks efficiently using a buffer memory.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a method of operating a data compression circuit, including receiving and storing a plurality of data blocks until a cache is full and writing the data blocks, which have been stored in the cache, to a buffer memory when the cache is full.

The method may further include performing forced encoding on each of the data blocks regardless of repetitiveness of each data block when the cache is full.

A size of the cache may be determined by a size of data that is able to be written to the buffer memory during a single cycle.

The writing the data blocks may include writing each of the data blocks to one of a plurality of memories respectively having addresses allocated using an interleaving method, such that memories may be included in the buffer memory.

Each of the memories may be a single-port static random access memory (SRAM).

The foregoing and/or other features and utilities of the present general inventive concept may also be achieved by providing a data compression circuit including a cache to receive and store a plurality of data blocks, a buffer memory to receive and store the data blocks output from the cache when the cache is full, and a compressed-data generation circuit to perform forced encoding on each of the data blocks regardless of repetitiveness of each data block.

A size of the cache may be determined by a size of data that is able to be written to the buffer memory during a single cycle.

The buffer memory may include a plurality of memories respectively having addresses allocated in an interleaving method to respectively store the data blocks, and each of the memories is a single-port static random access memory (SRAM).

The foregoing and/or other features and utilities of the present general inventive concept may also be achieved by providing a data processing system including a cache to receive and store a plurality of data blocks, a buffer memory to receive and store the data blocks output from the cache when the cache is full, and a compressed-data generation circuit to perform forced encoding on each of the data blocks regardless of repetitiveness of each data block, a host to output a data stream comprising the data blocks, and a data storage device to store encoded data blocks.

The data storage device may be a flash memory based data storage device and the data processing system may be a smart phone or a tablet personal computer (PC).

The foregoing and/or other features and utilities of the present general inventive concept may also be achieved by providing a method of operating a data compression circuit, method including reading a plurality of reference data blocks neighboring each other from a buffer memory simultaneously based on an address, comparing one of the reference data blocks with a data block, and encoding the data block according to a result of the comparison.

The method may further include comparing another one of the reference data blocks with a subsequent data block following the data block and encoding the subsequent data block according to a result of the comparison.

The encoding may include performing literal/literal encoding or length/distance encoding on the subsequent data block.

The reading the reference data blocks may simultaneously include simultaneously reading the reference data blocks from a plurality of memories, which respectively have addresses allocated using an interleaving method, based on the address.

The foregoing and/or other features and utilities of the present general inventive concept may also be achieved by providing a data processing system, including a host to generate an input data stream including a plurality of data blocks, and a memory controller to transmit and receive input data stream from the host, the memory controller including a data compression circuit that includes a cache to receive and store the plurality of data blocks, a buffer memory to store the plurality of data blocks within a plurality of internal memories when the cache is full such that the plurality of data blocks are each to be used as a plurality of reference data blocks to determine whether another data block to be processed is a repetition of one of the reference data blocks, and a compressed-data generation circuit to perform one of a plurality of types of encoding on the another data block based on the determination.

The buffer memory may perform literal/literal encoding by writing the another data block to one of the plurality of internal memories if the another data block to be processed is not a repetition of one of the reference data blocks, and the buffer memory may perform length/distance encoding by reading the another data block and a repetitive data block from one of the plurality of internal memories and writing the another data block to another one of the plurality of internal memories if the another data block to be processed is a repetition of one of the reference data blocks.

The data compression circuit may further include an input data register to receive the input data stream, to adjust the delay of each of the plurality data blocks included in the input data stream using delay circuits, and to generate a plurality of delay-adjusted data blocks, a cache controller to receive the input data stream and to control write operations and read operations of the cache, a comparison circuit to receive a second of the plurality of delay-adjusted data blocks and to determine whether the another data block is the same as the reference data block, and a buffer memory controller to receive a first of the plurality of delay-adjusted data blocks and to control at least one of an operation of writing a data block output from the cache to the buffer memory, to control an operation of writing the first delayed data block output from the input data register to the buffer memory, and an operation of transmitting a reference data block output from the buffer memory to the comparison circuit.

The input data register may transmit a third delayed data block to the compressed-data generation circuit such that comparison circuit compares the reference data block output from the buffer memory controller with the second delayed data block output from the input data register and outputs an indicator indicating whether the another data block is the same as the reference data block, in order to allow the compressed-data generation circuit to perform literal/literal encoding or length/distance encoding on the third delayed data block output from the input data register in response to the indicator.

The plurality of internal memories may each have a memory area corresponding to an address allocated using an interleaving method to store one of the plurality of data blocks.

The memory controller may further include a host interface to transmit the input data stream from the host to the memory controller during a data compression operation and to transmit a decompressed data stream from the memory controller to the host during a data decompression operation.

The memory controller may further include at least one data transmission controller to transmit data between the memory controller and at least one external storage device according to an interface protocol of the at least one external storage device, and a data decompression circuit to receive the data from the at least one external storage device to perform the data decompression operation on the received data.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIG. 7 is a flowchart of the encoding method illustrated in FIG. 6.

DETAILED DESCRIPTION OF THE PREFERRED EMBODIMENTS

Figure 1:
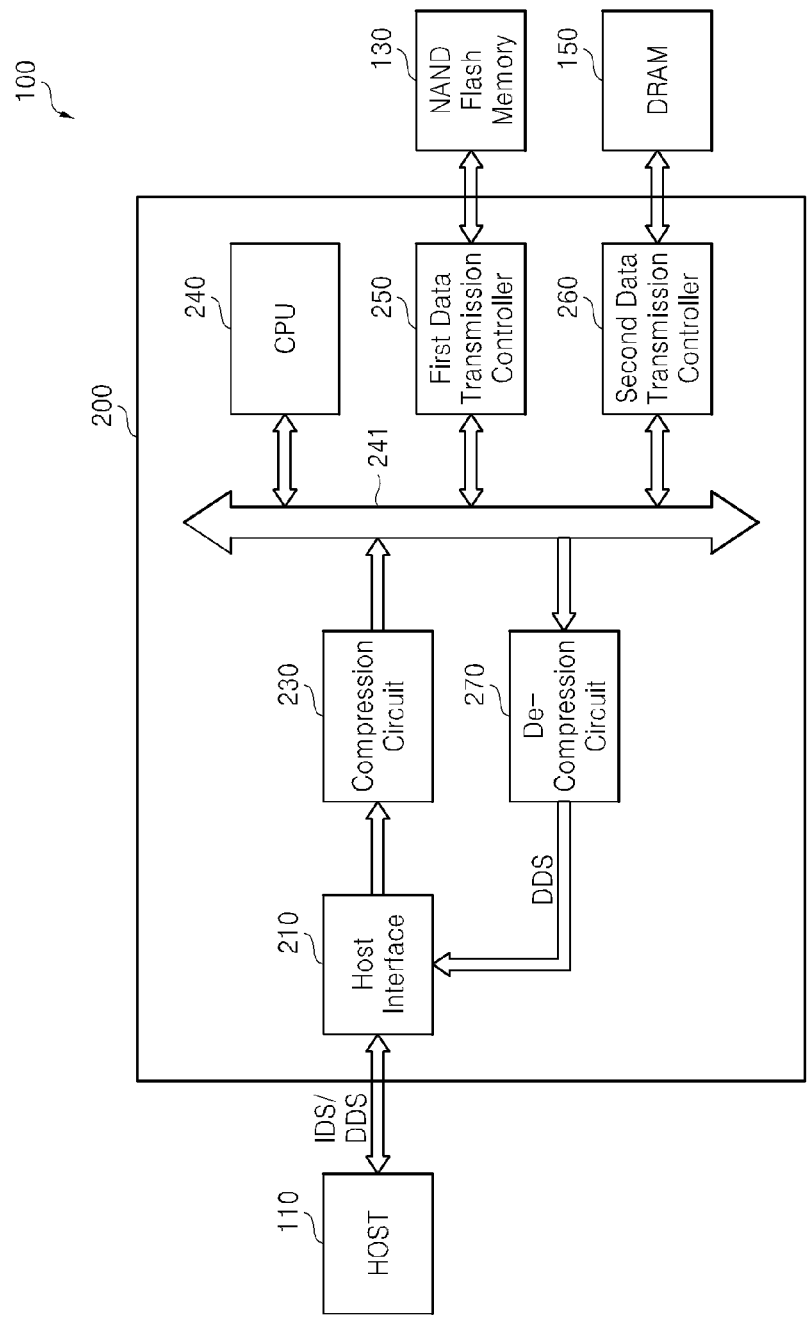
FIG. 1 is a block diagram of a data processing system according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a data processing system 100 according to an exemplary embodiment of the present general inventive concept. The data processing system 100 includes a host 110, a memory controller 200, a first storage device 130, and a second storage device 150.

At least two of the memory controller 200, the first storage device 130, and the second storage device 150 may be packaged together in a single package, e.g., package on package (PoP) or a multi-chip package (MCP).

The data processing system 100 may be implemented as a personal computer (PC), a data server, or a portable electronic device, but is not limited thereto. The portable electronic device may be a laptop computer, a mobile telephone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), or an e-book, but is not limited thereto.

The host 110 may output an input data stream (IDS) including a plurality of data blocks to the memory controller 200. Each of the data blocks may include N bytes (where N is 2 or a natural number greater than 2) to perform fast data compression.

The memory controller 200 may process, for example, encode, or bypass the data blocks one by one. The memory controller 200 may perform literal/literal encoding or length/distance encoding. It is apparent that the memory controller 200 can perform encoding in other various ways.

The literal/literal encoding may be applied to a non-repetitive or single data block. According to the literal/literal encoding, the non-repetitive or single data block is not encoded but bypassed. At this time, a buffer memory performs only an operation of writing the data block to one of a plurality of memories.

The length/distance encoding may be applied to a repetitive data block. When the length/distance encoding is used, the buffer memory may perform both an operation of reading the data block and a repetitive (or matching reference data) block from one of the plurality of memories and an operation of writing the data block to another one of the memories.

Here, it is assumed that a single data block is 4 bytes in length. However, the present general inventive concept is not restricted by a number of bytes included in a data block to be processed.

The memory controller 200 may interface (i.e., transmit) or process data and/or commands among the host 110, the first storage device 130, and the second storage device 150, based on a corresponding interface protocol.

The memory controller 200 may include a host interface 210, a data compression circuit 230, a central processing unit (CPU) or a processor 240, a first data transmission controller 250, a second data transmission controller 260, and a data decompression circuit 270. The memory controller 200 may be implemented as a system on chip (SoC).

The host interface 210, e.g., a host side interface, transmits data and/or commands between the host 110 and the memory controller 200. For instance, the host interface 210 transmits the input data stream IDS from the host 110 to the data compression circuit 230 during data compression and transmits a decompressed data stream DDS from the data decompression circuit 270 to the host 110 during data decompression.

The data compression circuit 230 may process data blocks one by one according to the control of the CPU 240. For instance, the data compression circuit 230 may perform the length/distance encoding (or bypass) or the length/distance encoding on each data block. At this time, the data compression circuit 230 functions as an encoder.

The CPU 240 may control the operation of at least one of the data compression circuit 230, the first data transmission controller 250, the second data transmission controller 260, and the data decompression circuit 270, through a data bus 241.

The first data transmission controller 250 may transmit data and/or commands between the memory controller 200 and the first storage device 130 according to an interface protocol of the first storage device 130. When the first storage device 130 is a NAND flash memory, the first data transmission controller 250 may be implemented as a NAND flash controller.

The second data transmission controller 260 may transmit data and/or commands between the memory controller 200 and the second storage device 150 according to an interface protocol of the second storage device 150. When the second storage device 150 is a dynamic random access memory (DRAM), the second data transmission controller 260 may be implemented as a DRAM controller.

The data decompression circuit 270 may decompress compressed data (e.g., data output from the first storage device 130 or the second storage device 150) and transmit the decompressed data stream DDS to the host 110 via the host interface 210. At this time, the data decompression circuit 270 functions as a decoder.

The first storage device 130 may be a flash based memory such as a flash memory, an embedded multimedia card (eMMC), a universal flash storage (UFS), a universal serial bus (USB) flash drive, or a solid state drive (SSD).

Alternatively, the first storage device 130 may be a non-volatile memory such as electrically erasable programmable read-only memory (EEPROM), magnetic random access memory (MRAM), spin-transfer torque MRAM, conductive bridging RAM (CBRAM), ferroelectric RAM (FeRAM), phase-change RAM (PRAM), resistive RAM (RRAM), nanotube RRAM, polymer RAM (PoRAM), nano floating gate memory (NFGM), holographic memory, molecular electronic memory device, or insulator resistance change memory, but is not limited thereto.

As another alternative, the first storage device 130 may be a hard disk drive.

The second storage device 150 may be DRAM or a double data rate (DDR) synchronous DRAM (SDRAM), but is not limited thereto. Data input to and/or output from the first storage device 130 may be temporarily stored in the second storage device 150 according to the control of the second memory controller 260.

Figure 2:
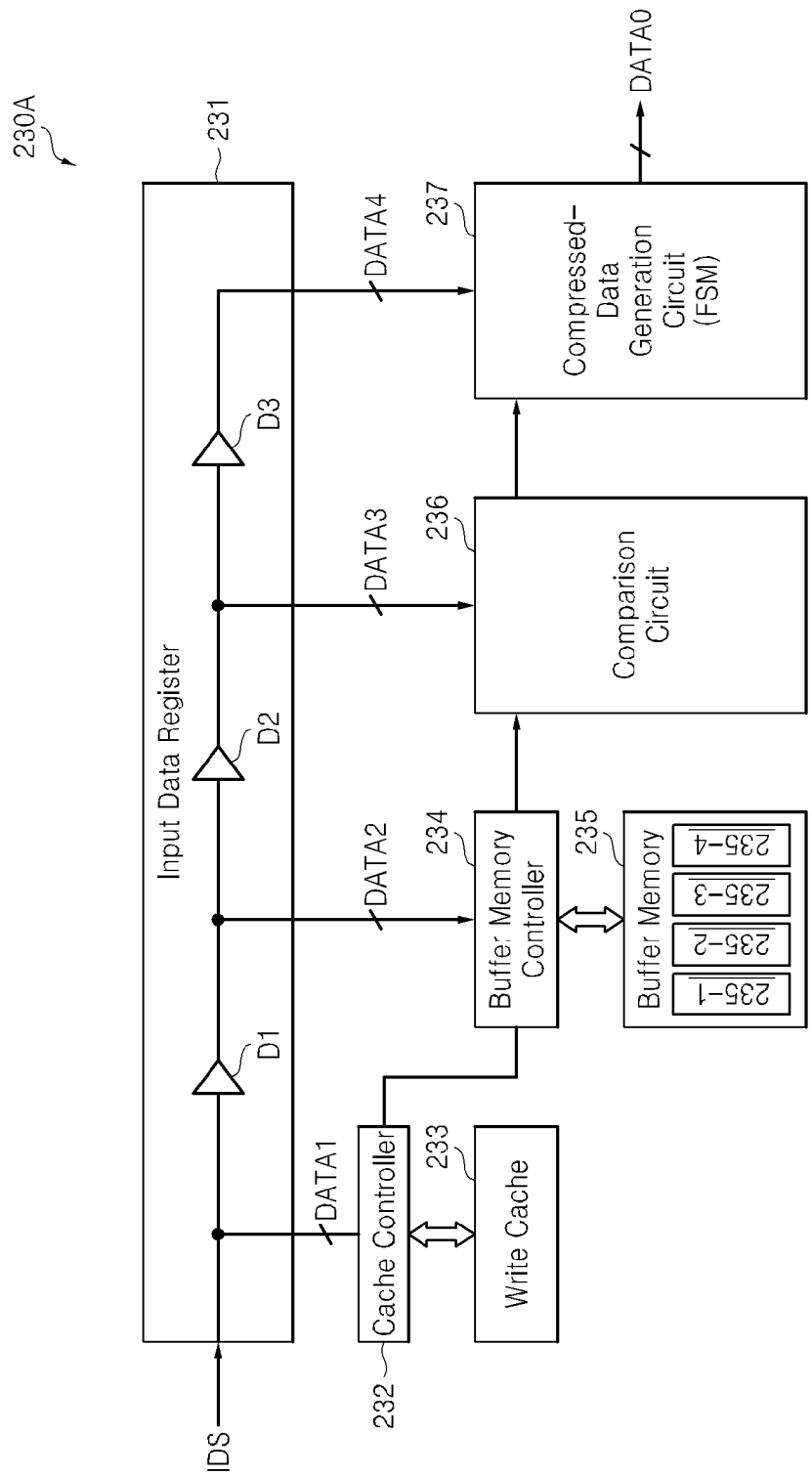
FIG. 2 is a block diagram of an example of a data compression circuit illustrated in FIG. 1.

FIG. 2 is a block diagram of an example 230A of the data compression circuit 230 illustrated in FIG. 1. Referring to FIG. 2, the data compression circuit 230A includes an input data register 231, a cache controller 232, a write cache 233, a buffer memory controller 234, a buffer memory 235, a comparison circuit 236, and a compressed-data generation circuit 237.

The input data register 231 may receive the input data stream IDS, adjust the delay of each of data blocks included in the input data stream IDS using a corresponding one of delay circuits D1, D2, and D3, and transmit delay-adjusted data blocks DATA2, DATA3, and DATA4 to the data processing circuits 234, 236, and 237, respectively.

According to FIG. 2, the input data register 231 may transmit a data block DATA1 included in the input data stream IDS to the cache controller 232, transmit the first delayed data block DATA2 to the buffer memory controller 234, transmit the second delayed data block DATA3 to the comparison circuit 236, and transmit the third delayed data block DATA4 to the compressed-data generation circuit 237.

In other exemplary embodiments, to perform on-the fly (i.e., real time) data processing, the input data register 231 may transmit the data block DATA1 included in the input data stream IDS to the cache controller 232 and transmit the third delayed data block DATA4 to the compressed-data generation circuit 237.

When the delay by the delay circuits D1 through D3 is not considered, the data blocks DATA1 through DATA4 may be the same data block.

Figure 3:
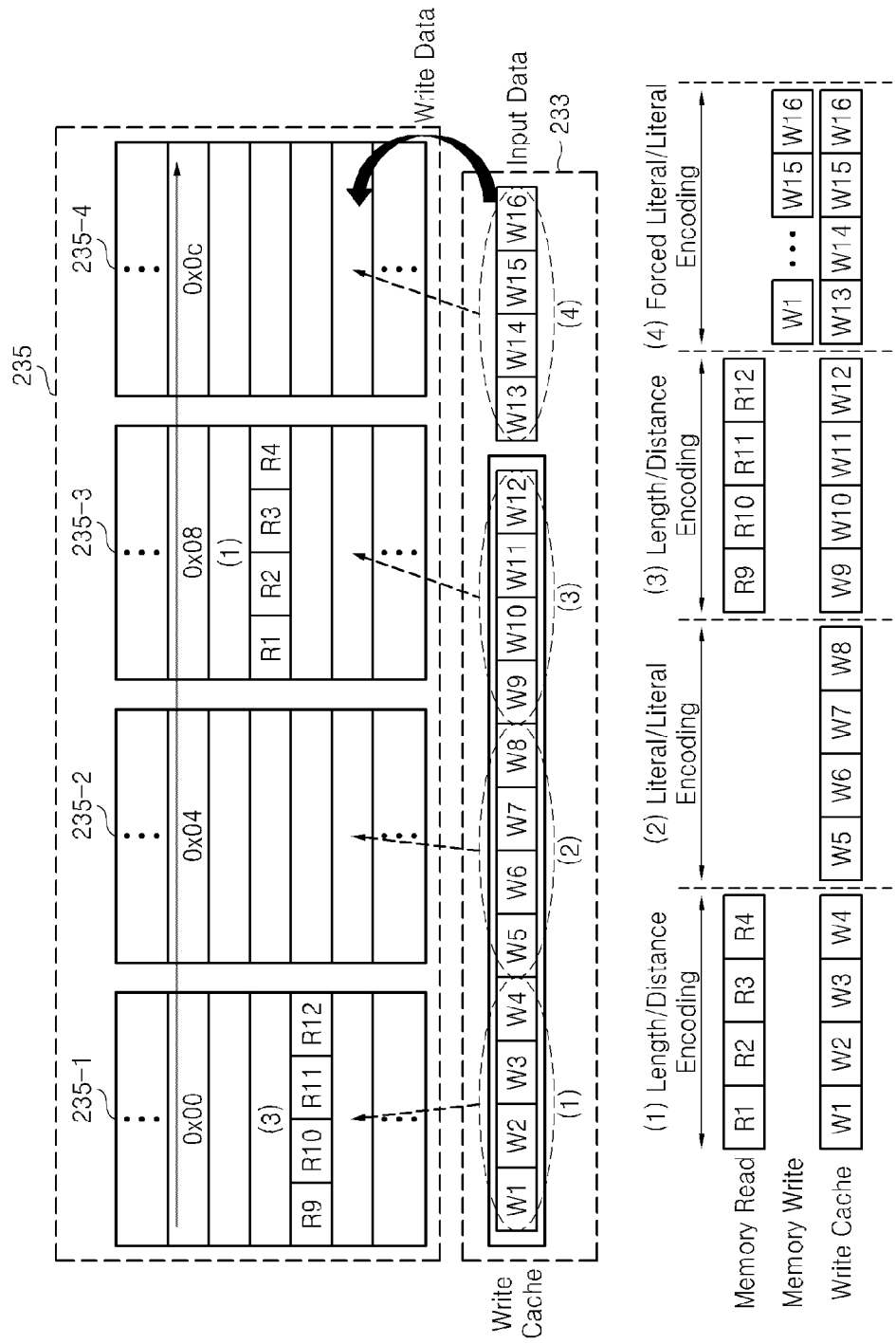
FIG. 3 is a conceptual diagram illustrating an encoding method performed by the data compression circuit illustrated in FIG. 1 according to an exemplary embodiment of the present general inventive concept.
Figure 4:
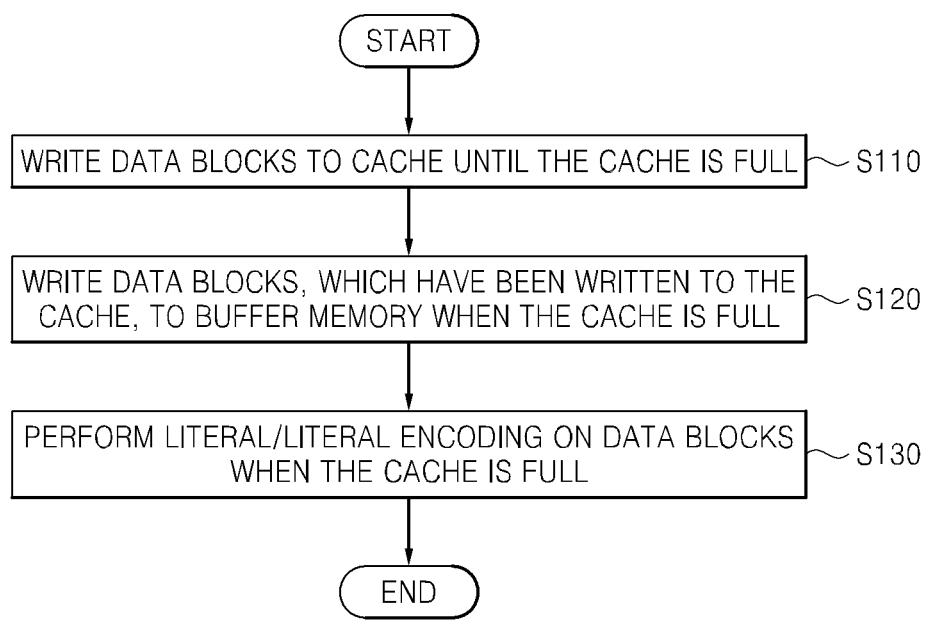
FIG. 4 is a flowchart of the encoding method illustrated in FIG. 3.

FIG. 3 is a conceptual diagram illustrating an encoding method performed by the data compression circuit 230 illustrated in FIG. 1 according to an exemplary embodiment of the present general inventive concept. FIG. 4 is a flowchart of the encoding method illustrated in FIG. 3.

Delay write and forced encoding, e.g., forced literal/literal encoding, will be described in detail with reference to FIGS. 1 through 4.

The data compression circuit 230A may perform the forced encoding, e.g., the forced literal/literal encoding on a plurality of data blocks on the fly (i.e., in real time) while using the buffer memory 235 including a plurality of memories, e.g., single-port static RAMs (SRAMs) 235-1 through 235-4.

Each of the single-port SRAMs 235-1 through 235-4 has a memory area corresponding to an address allocated using an interleaving method. Although four single-port SRAMs 235-1 through 235-4 are illustrated in FIGS. 2 and 3, the present general inventive concept is not limited thereto, and more SRAMs may be provided.

Unlike a dual-port SRAM, a single-port SRAM cannot perform simultaneously both a read operation and a write operation during one cycle, but is instead able to perform only one of the read operation and the write operation during one cycle.

Each of the single-port SRAMs 235-1 through 235-4 may include a plurality of memory areas. Each of the memory areas may store a data block. The data block stored in each memory area may be used as a reference data block used to determine the repetitiveness of a data block to be processed.

The cache controller 232 may control the operations, e.g., the write operation and the read operation, of the write cache 233. The cache controller 232 writes a plurality of data blocks W1W2W3W4, W5W6W7W8, W9W10W11W12, and W13W14W15W16 (collectively denoted by DATA1) to the write cache 233 until the write cache 233 is full in operation S110. The size of the write cache 233 is determined by a size or an amount of data that can be written to the buffer memory 235 during one cycle.

In order to reduce a number of cycles necessary to write the data blocks W1W2W3W4, W5W6W7W8, W9W10W11W12, and W13W14W15W16 to the buffer memory 235, the data blocks W1W2W3W4, W5W6W7W8, W9W10W11W12, and W13W14W15W16 are stored in the write cache 233. When the write cache 233 is full, the cache controller 232 writes the data blocks W1W2W3W4, W5W6W7W8, W9W10W11W12, and W13W14W15W16 that have been written to the write cache 233 to the single-port SRAMs 235-1 through 235-4 (or memory areas 235-1 through 235-4), respectively, in the buffer memory 235 in operation S120.

During normal encoding, when it is determined that the input data block W1W2W3W4 or W9W10W11W12 is the repetition of a reference data block R1R2R3R4 or R9R10R11R12 stored in the single-port SRAM 235-1 or 235-3 in the buffer memory 235, the reference data block R1R2R3R4 or R9R10R11R12 needs to be read from the single-port SRAM 235-1 or 235-3, as illustrated in parts (1) and (3) in FIG. 3, in order to compare the reference data block R1R2R3R4 or R9R10R11R12 with the input data block W1W2W3W4 or W9W10W11W12.

During the normal encoding, the comparison circuit 236 determines whether the input data block W1W2W3W4 or W9W10W11W12 (collective denoted by DATA3 this time) is the same as the reference data block R1R2R3R4 or R9R10R11R12 output from the buffer memory 235 and outputs an indicator (or indication signal) corresponding to the determination result to the compressed-data generation circuit 237.

In response to the indicator (or indication signal), the compressed-data generation circuit 237 performs length/distance encoding on the input data block W1W2W3W4 or W9W10W11W12 (collectively denoted by DATA4 this time) and outputs length/distance encoded data DATA0.

However, as illustrated in part (2) in FIG. 3, the input data block W5W6W7W8 is not repetitive, and therefore, the compressed-data generation circuit 237 performs literal/literal encoding on the input data block W5W6W7W8 (=DATA4) in response to the indicator output from the comparison circuit 236 and outputs literal/literal encoded data DATA0. In other words, the input data block W5W6W7W8 (=DATA4) is bypassed by the compressed-data generation circuit 237.

As described above, during delay write, the cache controller 232 writes the data blocks W1W2W3W4, W5W6W7W8, W9W10W11W12, and W13W14W15W16 that have been written to the write cache 233 to the single-port SRAMs 235-1 through 235-4 (or memory areas 235-1 through 235-4), respectively, in the buffer memory 235 in operation S120.

During forced encoding, e.g., forced literal/literal encoding, the compressed-data generation circuit 237 performs the forced literal/literal encoding on the data blocks W1W2W3W4, W5W6W7W8, W9W10W11W12, and W13W14W15W16 in operation S130, as illustrated in part (4) in FIG. 3, without determining whether each of the data blocks W1W2W3W4, W5W6W7W8, W9W10W11W12, and W13W14W15W16 is a repetition of one of the reference data blocks stored in the buffer memory 235.

The buffer memory controller 234 may control an operation of writing a data block output from the write cache 233 to the buffer memory 235, an operation of writing the first delayed data block DATA2 output from the input data register 231 to the buffer memory 235, and/or an operation of transmitting a reference data block output from the buffer memory 235 to the comparison circuit 236.

The comparison circuit 236 may compare a reference data block output from the buffer memory controller 234 with the second delayed data block DATA3 output from the input data register 231 and may output an indicator (or indication signal) indicating the repetitiveness of the second delayed data block DATA3 to the compressed-data generation circuit 237 according to the comparison result.

The compressed-data generation circuit 237 may perform literal/literal encoding or length/distance encoding on the third delayed data block DATA4 output from the input data register 231 in response to the indicator, and may output the output data DATA0 based on a result of the encoding.

As described above, the data compression circuit 230A processes a data block on the fly (i.e., in real time).

Figure 5:
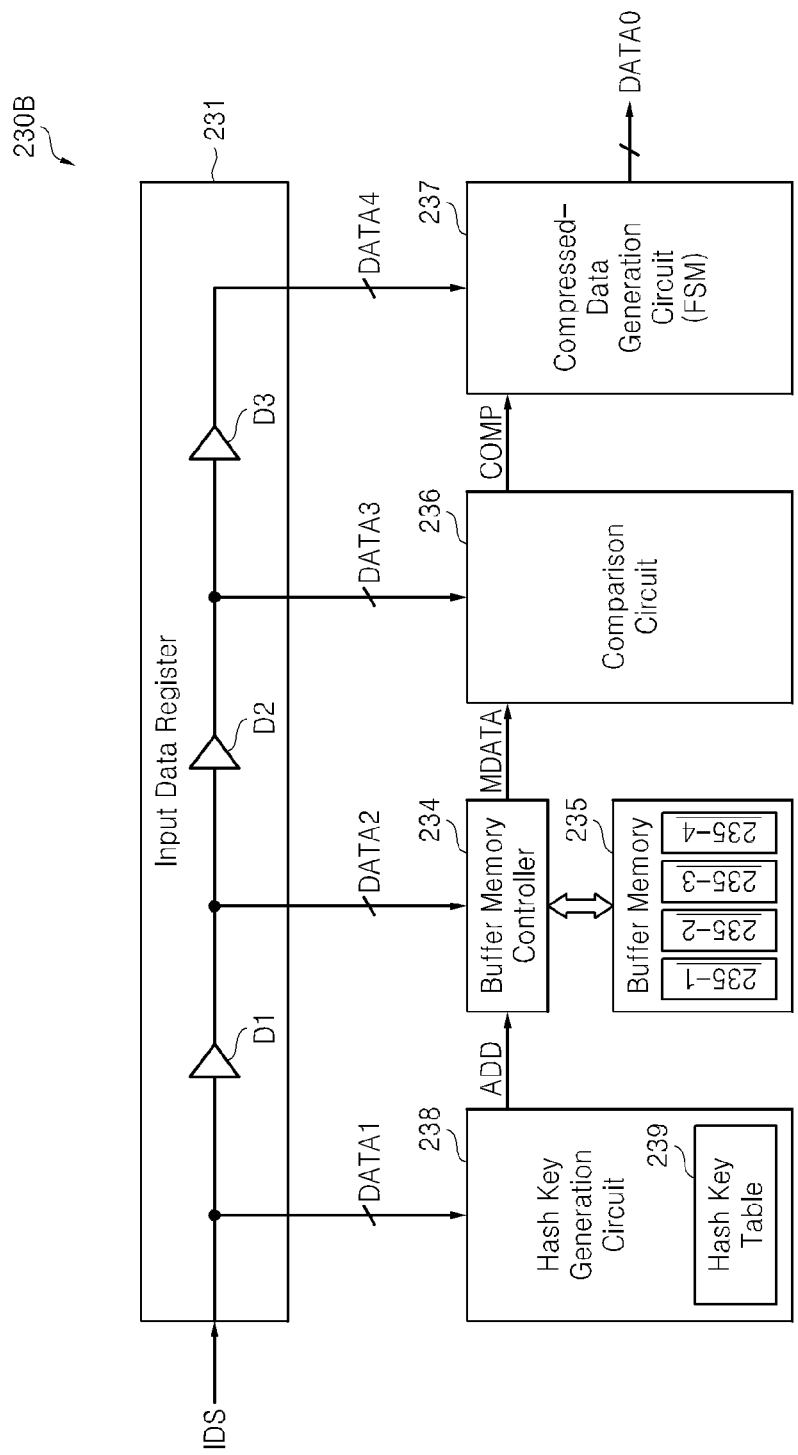
FIG. 5 is a block diagram of another example of a data compression circuit illustrated in FIG. 1 according to another exemplary embodiment of the present general inventive concept.

FIG. 5 is a block diagram of another example 230B of the data compression circuit 230 illustrated in FIG. 1. Except for a hash key generation circuit 238, the structure and the operations of the data compression circuit 230B illustrated in FIG. 5 are substantially the same as those of the data compression circuit 230A illustrated in FIG. 2.

Referring to FIG. 5, the hash key generation circuit 238 sequentially receives data blocks (or a data patterns) DATA1, generates a hash key corresponding to each of the data blocks DATA1, and writes a position or an address of each data block DATA1 to an entry which corresponds to the hash key in a hash key table 239.

When the data block DATA1 to be processed matches (i.e., is the same as) a data block that has been received previously, the hash key generation circuit 238 may output an address ADD corresponding to a hash key generated and associated with the data block DATA1 to the buffer memory controller 234.

Figure 6:
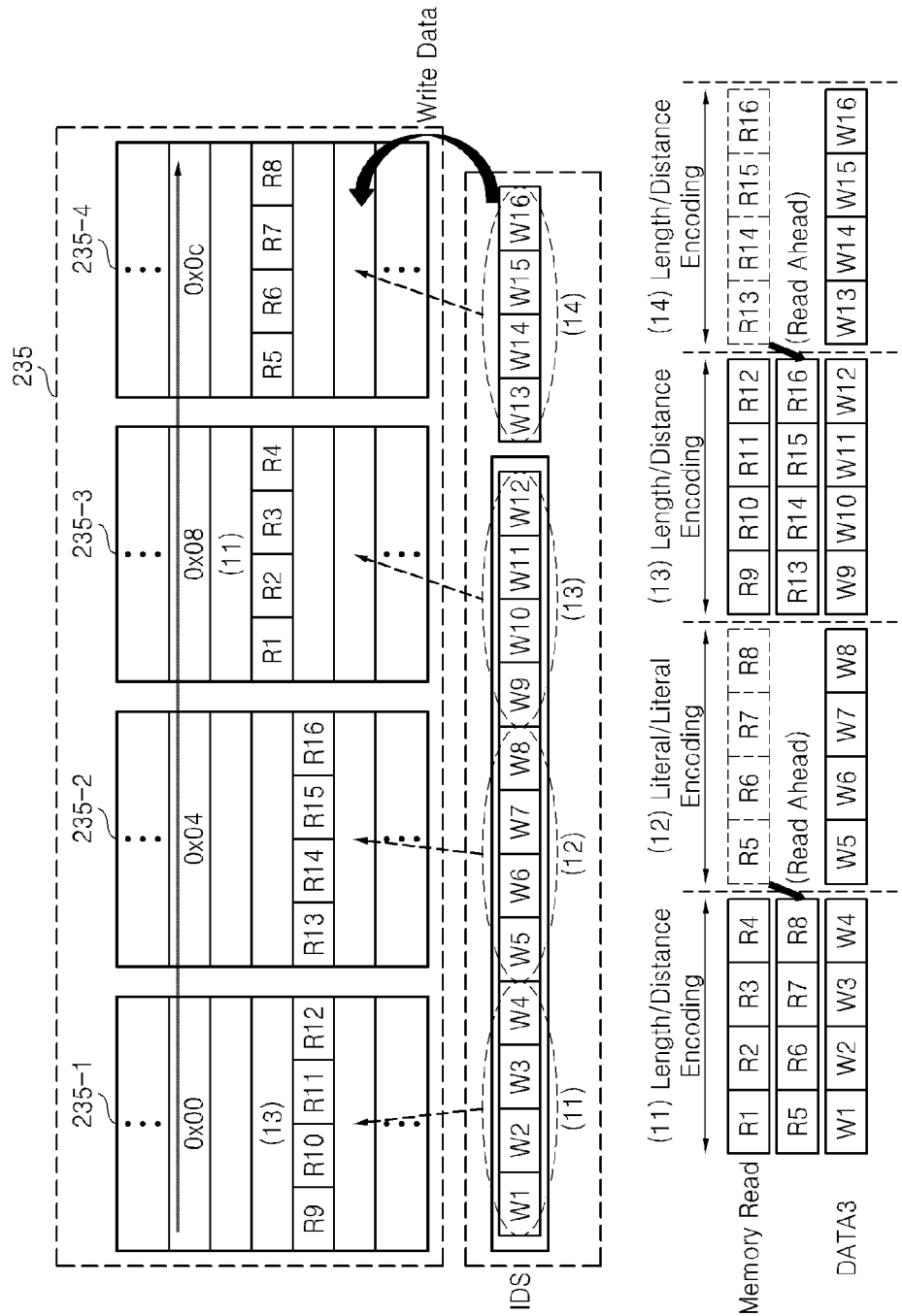
FIG. 6 is a conceptual diagram illustrating an encoding method performed by the data compression circuit illustrated in FIG. 1 according to another exemplary embodiment of the present general inventive concept.

FIG. 6 is a conceptual diagram illustrating an encoding method performed by the data compression circuit 230 illustrated in FIG. 1 according to another embodiment of the present general inventive concept. FIG. 7 is a flowchart of the encoding method illustrated in FIG. 6.

A read-ahead method will be described in detail with reference to FIG. 1 and FIGS. 5 through 7.

When there is possibility that a current data block to be processed is repetition of a previous data block, the hash key generation circuit 238 outputs an address ADD of the previous data block to the buffer memory controller 234.

Referring to FIGS. 5 and 6, the buffer memory controller 234 reads a plurality of reference data blocks MDATA including a reference data block R9R10R11R12 corresponding to the previous data block from the buffer memory 235 at a time in response to the address ADD and transmits the reference data blocks MDATA to the comparison circuit 236 in operation S210.

In addition, the buffer memory controller 234 stores the current data block DATA2 in the buffer memory 235. The comparison circuit 236 receives and stores the reference data blocks MDATA. The comparison circuit 236 compares one block R9R10R11R12 among the reference data blocks MDATA with the current data block DATA3, i.e., W9W10W11W12 in operation S220, and transmits an indicator to the compressed-data generation circuit 237 according to a result of the comparison.

The compressed-data generation circuit 237 performs length/distance encoding on the current data block DATA4, i.e., W9W10W11W12 based on the indicator, and outputs length/distance-encoded data DATA0 in operation S230. Continuously, the comparison circuit 236 compares another block R13R14R15R16 among the reference data blocks MDATA with another current data block DATA3, i.e., W13W14W15W16 to be processed in operation S240, and transmits an indicator to the compressed-data generation circuit 237 according to a result of the comparison.

The compressed-data generation circuit 237 performs the length/distance encoding on the current data block DATA4, i.e., W13W14W15W16 based on the indicator, and outputs length/distance-encoded data DATA0 in operation S250.

As illustrated in part (11) in FIG. 6, when a data block W1W2W3W4, which will be processed in a current cycle, is the repetition of a reference data block R1R2R3R4, the buffer memory controller 234 reads the reference data block R1R2R3R4 and a reference data block R5R6R7R8, which has a high possibility to be read in a subsequent cycle, at a time based on an address ADD indicating a memory area in the memory 235-3 in which the reference data block R1R2R3R4 has been stored. The buffer memory controller 234 transmits the reference data blocks R1R2R3R4 and R5R6R7R8 to the comparison circuit 236.

Since the reference data blocks R1R2R3R4 and R5R6R7R8 neighboring each other are read simultaneously in the current cycle, the buffer memory controller 234 does not read the reference data block R5R6R7R8 separately in the subsequent cycle.

Accordingly, a cycle required to read the reference data block R5R6R7R8 is saved. Since the data block W1W2W3W4 is the same as the reference data block R1R2R3R4 in the current cycle, the data block W1W2W3W4 (=DATA4) is subjected to the length/distance encoding in operation S250.

However, as illustrated in part (12) in FIG. 6, when a data block W5W6W7W8 in the subsequent cycle is different from the reference data block R5R6R7R8, the data block W5W6W7W8 (=DATA4) is subjected to the literal/literal encoding, for example, the data block W5W6W7W8 is bypassed in operation S250.

As illustrated in part (13) in FIG. 6, when the data block W9W10W11W12 to be processed in a current cycle is the repetition of the reference data block R9R10R11R12, the buffer memory controller 234 simultaneously reads the reference data block R9R10R11R12 and the reference data block R13R14R15R16 having a high possibility to be read in a subsequent cycle and transmits the reference data blocks R9R10R11R12 and R13R14R15R16 to the comparison circuit 236.

Since the reference data blocks R9R10R11R12 and R13R14R15R16 neighboring each other are read simultaneously in the current cycle, the buffer memory controller 234 does not read the reference data block R13R14R15R16 separately in the subsequent cycle.

As illustrated in part (13) in FIG. 6, when the data block W9W10W11W12 is the same as the reference data block R9R10R11R12 in the current cycle, the data block W9W10W11W12 (=DATA4) is subjected to the length/distance encoding in operation S250.

As illustrated in part (14) in FIG. 6, when the data block W13W14W15W16 is the same as the reference data block R13R14R15R16 in the subsequent cycle, the data block W13W14W15W16 (=DATA4) is subjected to the length/distance encoding in operation S250.

As described above, according to exemplary embodiments of the present general inventive concept, an input data block is processed and output in a single cycle, so that on-the-fly (i.e., real time) encoding is performed on the input data block.

In addition, a subsequent reference data block is read ahead, thereby saving a cycle required for a read operation on a buffer memory.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of operating a data compression circuit, the method comprising:
receiving and storing a plurality of data blocks output from a input data register until a cache is full;
writing the data blocks, which have been stored in the cache, to a buffer memory when the cache is full;
performing forced encoding on each delay-adjusted data block output from the input data register regardless of repetitiveness of each delay-adjusted data block without determining a repetitiveness of the delay-adjusted data blocks, wherein the writing the data blocks to the buffer memory comprises writing each of the data blocks to one of a plurality of memories respectively having addresses allocated using an interleaving method, wherein the buffer memory includes the plurality of the memories, wherein the input data register receives an input data stream including the data blocks, adjusts a delay of each of the data blocks using delay circuits, and generates a plurality of delay-adjusted data blocks, and wherein the delay circuits are connected between an input of the cache and an input of the compressed-data generation circuit.

2. The method of claim 1, wherein a size of the cache is determined by a size of data that is able to be written to the buffer memory during a single cycle.

3. The method of claim 1, wherein each of the memories is a single-port static random access memory (SRAM).

4. A data compression circuit, comprising:
a cache to receive and store a plurality of data blocks;
a buffer memory to receive and store the data blocks output from the cache when the cache is full;
an input data register to receive an input data stream including the data blocks, to adjust a delay of each of the data blocks using delay circuits, and to generate a plurality of delay-adjusted data blocks;
a compressed-data generation circuit to perform forced encoding on each of the delay-adjusted data blocks regardless of repetitiveness of each delay-adjusted data block without determining a repetitiveness of the plurality of delay-adjusted data blocks; and
a cache controller to receive the input data stream and to control write operation and read operation,
wherein the input data register transmits the data blocks to the cache controller and transmits the delay-adjusted data block to the compressed-data generation circuit,
wherein the delay circuits are connected between an input of the cache and an input of the compressed-data generation circuit.

5. The data compression circuit of claim 4, wherein a size of the cache is determined by a size of data that is able to be written to the buffer memory during a single cycle.

6. The data compression circuit of claim 4, wherein the buffer memory comprises a plurality of memories respectively having addresses allocated in an interleaving method to respectively store the data blocks, and each of the memories is a single-port static random access memory (SRAM).

7. A method of operating a data compression circuit, the method comprising:
reading a plurality of reference data blocks neighboring each other from a buffer memory simultaneously based on an address;
delaying, with delay circuits, data blocks of an input data stream to generate second delayed data blocks and third delayed data blocks;
comparing, by the comparator, one of the reference data blocks output from a buffer memory controller with a second delayed data block output from the input data register;
outputting an indicator indicating whether the second delayed data block is the same as the reference data block; and
selecting a method for encoding a third delayed data block output from the input data based on the indicator.

8. The method of claim 7, further comprising:
comparing another one of the reference data blocks with a subsequent delayed data block following the delayed data block; and
encoding the subsequent delayed data block based on a result of the comparison.

9. The method of claim 8, wherein the encoding comprises performing one of literal/literal encoding and length/distance encoding on the subsequent delayed data block.

10. The method of claim 7, wherein the reading the reference data blocks simultaneously comprises simultaneously reading the reference data blocks from a plurality of memories, which respectively have addresses allocated using an interleaving method, based on the address.

11. A data processing system, comprising:
a host to generate an input data stream including a plurality of data blocks; and
a memory controller to transmit and receive the input data stream from the host, the memory controller comprising a data compression circuit that comprises:
an input data register to receive the input data stream, to adjust a delay of each of the plurality data blocks included in the input data stream using delay circuits, and to generate a plurality of delay-adjusted data blocks;
a cache to receive and store the plurality of data blocks;
a buffer memory to store the plurality of data blocks within a plurality of internal memories when the cache is full such that the plurality of data blocks are each to be used as a plurality of reference data blocks to determine whether a delay-adjusted data block to be processed is a repetition of one of the reference data blocks; and
a compressed-data generation circuit to perform one of a plurality of types of encoding on the delay-adjusted data block based on the determination,
wherein the input data register transmits a third delayed data block to the compressed-data generation circuit such that comparison circuit compares the reference data block output from the buffer memory controller with the second delayed data block output from the input data register and outputs an indicator indicating whether the another data block is the same as the reference data block, in order to allow the compressed-data generation circuit to perform literal/literal encoding or length/distance encoding on the third delayed data block output from the input data register in response to the indicator.

12. The data processing system of claim 11, wherein:
the buffer memory performs literal/literal encoding by writing the delay-adjusted data block to one of the plurality of internal memories if the delay-adjusted data block to be processed is not a repetition of one of the reference data blocks; and
the buffer memory performs length/distance encoding by reading the delay-adjusted data block and a repetitive data block from one of the plurality of internal memories and writing the delay-adjusted data block to another one of the plurality of internal memories if the delay-adjusted data block to be processed is a repetition of one of the reference data blocks.

13. The data processing system of claim 11, wherein the data compression circuit further comprises:
a cache controller to receive the input data stream and to control write operations and read operations of the cache;

a comparison circuit to receive a second of the plurality of delay-adjusted data blocks and to determine whether the delay-adjusted data block is the same as the reference data block; and a buffer memory controller to receive a first of the plurality of delay-adjusted data blocks and to control at least one of an operation of writing a data block output from the cache to the buffer memory, to control an operation of writing the first delayed data block output from the input data register to the buffer memory, and an operation of transmitting a reference data block output from the buffer memory to the comparison circuit.

14. The data processing system of claim 11, wherein the plurality of internal memories each has a memory area corresponding to an address allocated using an interleaving method to store one of the plurality of data blocks.

15. The data processing system of claim 11, wherein the memory controller further comprises:

a host interface to transmit the input data stream from the host to the memory controller during a data compression operation and to transmit a decompressed data stream from the memory controller to the host during a data decompression operation.

16. The data processing system of claim 15, wherein the memory controller further comprises:

at least one data transmission controller to transmit data between the memory controller and at least one external storage device according to an interface protocol of the at least one external storage device; and a data decompression circuit to receive the data from the at least one external storage device to perform the data decompression operation on the received data.

* * * * *